US008479585B2

(12) United States Patent
Shaw-Klein

(10) Patent No.: US 8,479,585 B2
(45) Date of Patent: Jul. 9, 2013

(54) PRESSURE SENSING OR FORCE GENERATING DEVICE

(75) Inventor: Lori J. Shaw-Klein, Rochester, NY (US)

(73) Assignee: Micropen Technologies Corporation, Honeoyo Falls, NY (US)

( * ) Notice: Subject to any disclaimer, the term of this patent is extended or adjusted under 35 U.S.C. 154(b) by 68 days.

(21) Appl. No.: 13/227,262

(22) Filed: Sep. 7, 2011

(65) Prior Publication Data
US 2012/0055257 A1 Mar. 8, 2012

Related U.S. Application Data

(60) Provisional application No. 61/380,965, filed on Sep. 8, 2010.

(51) Int. Cl.
G01L 1/00 (2006.01)
(52) U.S. Cl.
USPC ............................................................ 73/777
(58) Field of Classification Search
USPC ............................................................ 73/777
See application file for complete search history.

(56) References Cited

U.S. PATENT DOCUMENTS

| 4,555,953 | A | | 12/1985 | Dario et al. |
| 4,559,832 | A | | 12/1985 | Burlage et al. |
| 4,671,295 | A | | 6/1987 | Abrams et al. |
| 4,837,129 | A | * | 6/1989 | Frisch et al. ............ 430/319 |
| 5,044,053 | A | | 9/1991 | Kopel et al. |
| 5,046,503 | A | | 9/1991 | Schneiderman |
| 5,135,001 | A | | 8/1992 | Sinofsky et al. |
| 5,240,004 | A | | 8/1993 | Walinsky et al. |
| 5,311,884 | A | | 5/1994 | Scopelianos |
| 5,611,807 | A | | 3/1997 | O'Boyle |
| 5,760,530 | A | | 6/1998 | Kolesar |
| 5,785,051 | A | | 7/1998 | Lipscher et al. |
| 5,787,051 | A | | 7/1998 | Goodway et al. |
| 5,911,158 | A | | 6/1999 | Henderson et al. |
| 6,296,615 | B1 | | 10/2001 | Brockway et al. |
| 6,398,736 | B1 | | 6/2002 | Seward |
| 6,709,396 | B2 | | 3/2004 | Flesch et al. |
| 7,082,834 | B2 | | 8/2006 | Petrova et al. |

(Continued)

FOREIGN PATENT DOCUMENTS
WO 98/50773 A2 11/1998

OTHER PUBLICATIONS

International Search Report and Written Opinion for corresponding PCT/US2011/050697 (Apr. 9, 2012).

Primary Examiner — Lisa Caputo
Assistant Examiner — Octavia D. Hollington
(74) Attorney, Agent, or Firm — LeClairRyan, a Professional Corporation

(57) ABSTRACT

In one aspect, the present invention relates to a pressure sensing/force generating device comprising a non-planar substrate, a printed pressure sensitive element comprising (a) a piezoelectric material containing ink composition capable of producing a piezoelectric effect/piezoresistive effect and/or (b) a dielectric material containing ink composition capable of producing a capacitive effect. It also includes a first printed electrode comprising a conductive ink composition, and a second printed electrode comprising a conductive ink composition. The first and second electrodes are in electrical contact with the printed pressure sensitive element. The first and second printed electrodes and the printed pressure sensitive element collectively form a pressure sensitive junction, which is coupled to the non-planar substrate. The present invention further relates to medical devices comprising the pressure sensing/force generating device and methods of making such devices.

41 Claims, 7 Drawing Sheets

U.S. PATENT DOCUMENTS

| | | |
|---|---|---|
| 7,338,622 B2 | 3/2008 | Dorfman |
| 7,591,844 B2 | 9/2009 | Llanos et al. |
| 2004/0060362 A1 | 4/2004 | Kjellmann et al. |
| 2005/0148884 A1 | 7/2005 | Parks et al. |
| 2007/0135718 A1 | 6/2007 | Corl et al. |
| 2007/0234814 A1 | 10/2007 | Silverbrook et al. |
| 2008/0009750 A1 | 1/2008 | Aeby et al. |
| 2008/0058652 A1 | 3/2008 | Payne |
| 2010/0004718 A1 | 1/2010 | Doron et al. |
| 2011/0015512 A1 | 1/2011 | Pan et al. |
| 2011/0045253 A1* | 2/2011 | Nielsen et al. ............ 428/195.1 |
| 2011/0277803 A1* | 11/2011 | Grande et al. ............... 136/225 |

* cited by examiner

Figure 2 (section AA from Fig 1)

Figure 4 (section AA from Figure 3)

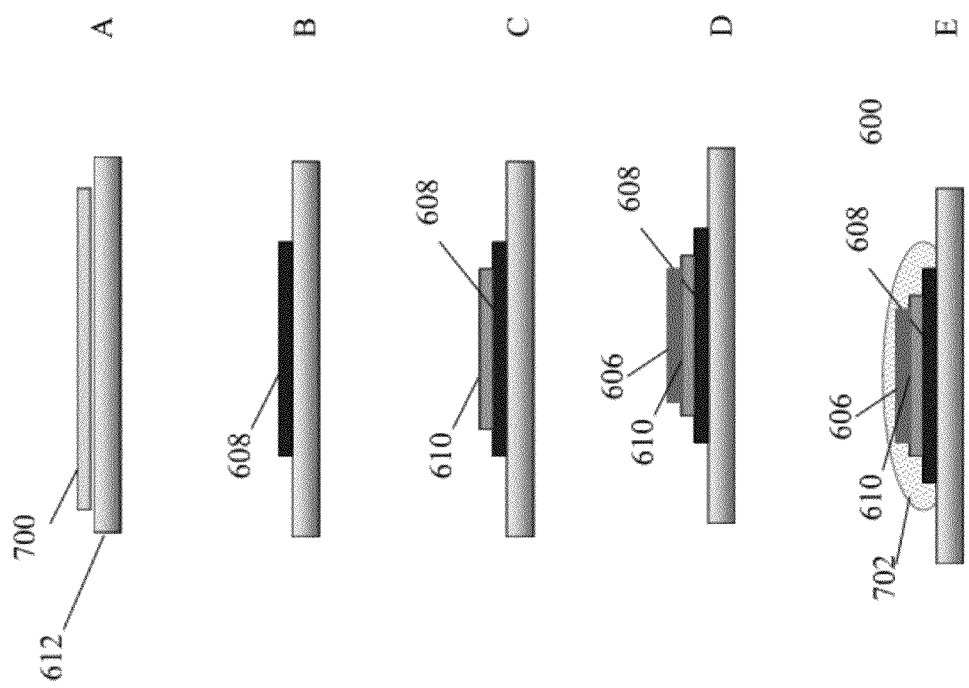
Figure 7 (section AA from Fig 6)

PRESSURE SENSING OR FORCE GENERATING DEVICE

This application claims the benefit of U.S. Provisional Patent Application Ser. No. 61/380,965, filed Sep. 8, 2010, which is hereby incorporated by reference in its entirety.

FIELD OF THE INVENTION

The present invention is related to a pressure sensing or force generating device.

BACKGROUND OF THE INVENTION

Accurate measurements of pressure, stress, force, or deflection are required in many technical applications. Piezoactive materials generate a change in resistance or produce a voltage upon application of pressure or deformation and are a convenient choice to enable such measurements. These materials may also be used as actuators or force generators which exhibit deflection or vibration as a voltage is applied. Similarly, changes in capacitance can also be used to measure pressure, stress, force or deflection. Most capacitors are designed to maintain a fixed physical structure. However, various factors, such as pressure, can change the structure of the capacitor, and the resulting change in capacitance can be used to sense those factors.

In many cases it is desirable to introduce such functionality directly to the surface of an object which is frequently three-dimensional, and/or non-planar. Screen printing can be utilized to apply a pressure sensitive material in a specific area or pattern of a three dimensional object or substrate, but only if the object is sufficiently stiff or has a stiff backing, and also has a regular geometry which is substantially planar or cylindrical. If the object is flexible, which is the case with most polymeric medical devices, a stiff backing material must be held behind the object to enable accurate and usable screen printing. If the object is non-planar or irregular in shape, such a backing would be extremely inconvenient and could be impossible to apply.

It is possible to envision producing such sensors or actuators and then applying or gluing them directly to the three dimensional surface of the object; however, this carries the risk that the sensors may become dislodged during use and, in the case of medical devices, that sharp edges at the glued interface may cause discomfort or trauma as the device is inserted or used.

U.S. Pat. No. 5,785,051 to Lipscher et al. describes an endotracheal tube with a piezoelectric ultrasonic transducer applied on the outside or the inside of the cuff. In this case the piezoelectric element is manufactured separately and affixed to the device. This approach poses difficulties in identification and use of effective adhesives. If the transducer is affixed inside the cuff, it is very difficult to access and control accurate placement; while, if it positioned on the outside of the cuff, the aforementioned sharp edges can cause tissue damage during intubation.

U.S. Pat. No. 5,046,503 to Schneiderman describes a similar transducer bonded to a catheter to aid in measurement of blood flow. In this case, the concept of "painting on" the connecting leads is disclosed, but the transducer still must be affixed in a separate step leading to the above-noted difficulties.

U.S. Pat. No. 5,611,807 to O'Boyle describes a method in which an entire medical balloon is comprised of a piezoelectric polymer. The polymer is directly extruded into a balloon shape, and the entire balloon is used as an ultrasonic vibration source to treat stenosis. One major disadvantage of such an approach is that piezoactive polymers are unable to withstand the inflation pressures that can be applied to balloons of more commonly used materials such as polyethylene (terephthalate) and polyurethane. Another disadvantage of this approach is that the most effective piezoactive materials are also very expensive. As a result, making an entire medical device from one is not cost effective since only a small fraction of the area is generally required to be piezoactive.

WO 1998/050773 to Charych et al. describes a cantilever biosensor which responds to a chemical stimulus or binding event with an electrical output. The cantilever beam is comprised of a piezoelectric material, and the entire sensor is manufactured using a subtractive MEMS approach. Such an approach does not lend itself easily to polymeric substrates with complex shape, but rather is designed for flat substrates. In addition, the starting materials and processes are difficult and complex compared with direct write techniques using common ink or paste materials.

U.S. Patent Application Publication No. 2008/0009750 to Aeby et al. describes a unique force sensing approach used for detection of pressure on catheters. Reflectors, optical sources, and detectors are mounted triaxially in a housing which is mounted on the tip of a catheter. Deformation due to contact force of the catheter tip results in differences in light reflected from the surfaces which can then be detected through a plurality of fiber optics. While this approach is creative, it is cumbersome, expensive to execute, and limited in the types of surfaces to which it could be successfully affixed.

The present invention is directed to overcoming these and other deficiencies in the art.

SUMMARY OF THE INVENTION

In one aspect, the present invention relates to a pressure sensing/force generating device comprising a non-planar substrate, a printed pressure sensitive element comprising (a) a piezoactive material containing ink composition capable of producing a piezoelectric effect/piezoresistive effect and/or (b) a dielectric material containing ink composition capable of producing a capacitive effect. It also includes a first printed electrode comprising a conductive ink composition, and a second printed electrode comprising a conductive ink composition. The first and second electrodes are in electrical contact with the printed pressure sensitive element. The first and second printed electrodes and the printed pressure sensitive element collectively form a pressure sensitive junction, which is coupled to the non-planar substrate.

In another aspect, the present invention relates to a method of forming a pressure sensing/force generating device. The method comprises providing a non-planar substrate and applying a pressure sensitive junction to the non-planar substrate. The pressure sensitive junction comprises (a) a printed pressure sensitive element capable of producing a piezoelectric/piezoresistive effect and comprising a piezoactive material containing ink composition and/or (b) a printed pressure sensitive element capable of producing a capacitive effect and comprising a dielectric material containing ink composition. The pressure sensing/force generating device also includes a first printed electrode comprising a conductive ink composition, and a second printed electrode comprising a conductive ink composition. The first and second electrodes are in electrical contact with the printed pressure sensitive element to collectively form the pressure sensitive junction.

In yet another aspect, the present invention relates to a medical device comprising the pressure sensing/force generating device of the present invention.

Piezoelectric or capacitive materials have been used as pressure sensors/force generating devices. Piezoelectric materials have been incorporated in catheters for some time. However, these have drawbacks and limitations as discussed supra. The present invention provides multiple benefits over the state of the art. The present invention produces pressure sensitive and force generating devices that are compact, streamlined, less likely to cause trauma upon contact with tissue, and less likely to dislodge, shift, or detach from the substrate. In the embodiments of the present invention where the pressure sensitive/force generating device provides functionalities in addition to pressure measurement, the present invention provides more closely coupled systems, reduced device count, more dense packing of devices, and reduced interconnection complexity.

BRIEF DESCRIPTION OF THE DRAWINGS

FIGS. 7A-E show cross-sectional views of the sequential fabrication steps that may be used in constructing a pressure sensitive capacitive device of the present invention. The views are shown along section AA in FIG. 6.

DETAILED DESCRIPTION OF THE INVENTION

In one aspect, the present invention relates to a pressure sensing/force generating device comprising a non-planar substrate, a printed pressure sensitive element comprising (a) a piezoactive material containing ink composition capable of producing a piezoelectric effect/piezoresistive effect and/or (b) a dielectric material containing ink composition capable of producing a capacitive effect. It also includes a first printed electrode comprising a conductive ink composition, and a second printed electrode comprising a conductive ink composition. The first and second electrodes are in electrical contact with the printed pressure sensitive element. The first and second printed electrodes and the printed pressure sensitive element collectively form a pressure sensitive junction, which is coupled to the non-planar substrate.

For the piezoelectric effect and the capacitive effect the first and the second electrodes are electrically isolated from one another. On the other hand those electrodes are in electrical contact with one another to achieve the piezoresistive effect. By "electrical contact" it is meant that the two electrodes allow current to flow through, however, they do not necessarily have physical contact. For example, the first and the second electrodes may be positioned such that they are physically isolated from one another but maintain electrical contact with the piezoresistive material. The piezoresistive material provides the electrical contact between the first and the second electrodes.

Figure 1:
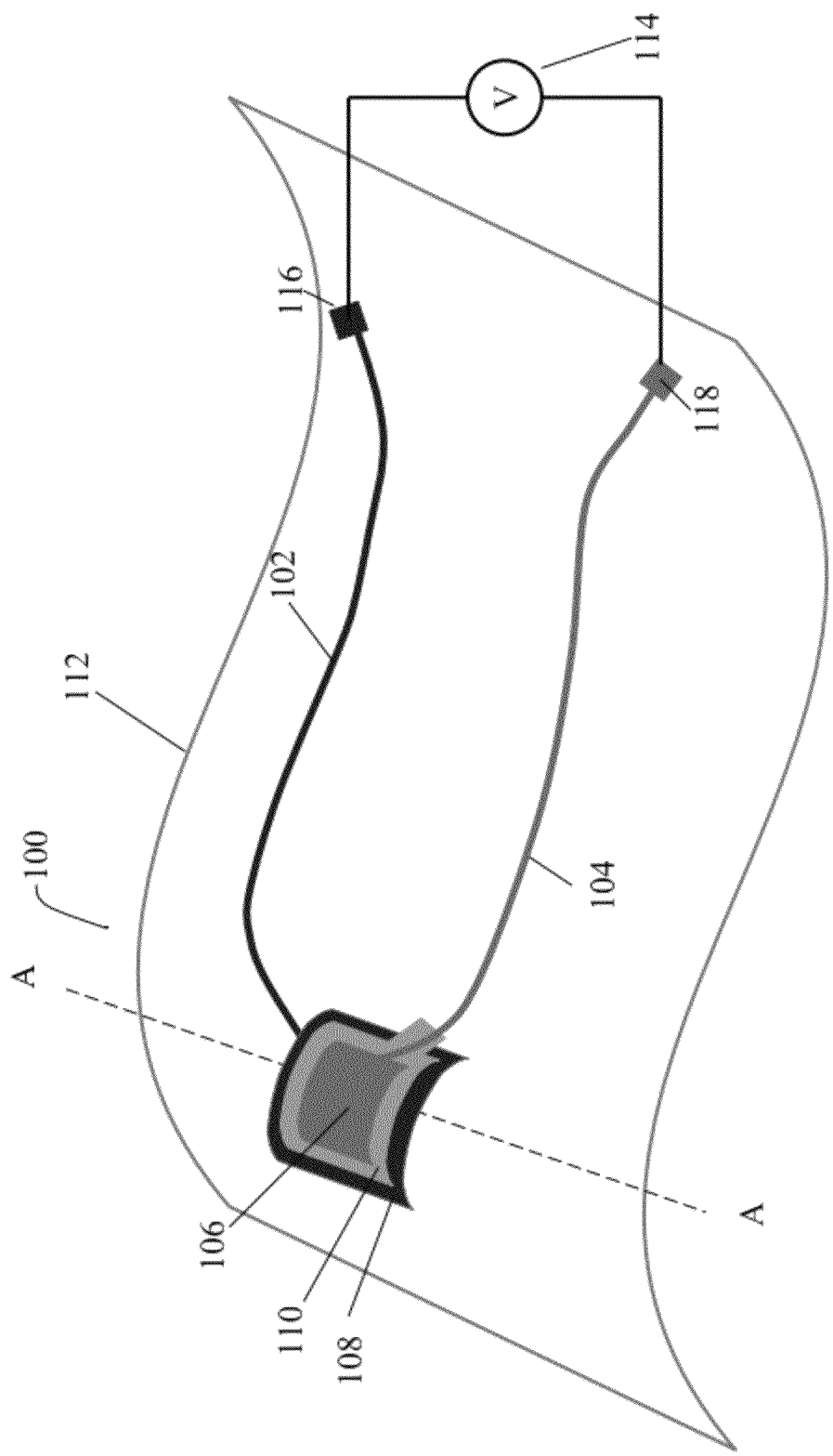
FIG. 1 shows a perspective view of one embodiment of a piezoelectric device of the present invention disposed on a non-planar medical device substrate.

Referring now to FIG. 1, piezoelectric device 100 has two electrical leads, 102 and 104, leading to first and second electrodes 108 and 106, respectively. These electrodes sandwich piezoelectric element 110. The electrodes 102 and 104 may be chosen from the same or different materials, as long as they are sufficiently electrically conductive. The device is disposed on a medical device substrate 112, which can be any "three dimensional" medical device. In this construction, such a piezoelectric element 110 may be effectively and permanently polarized by applying a voltage using pads 106 and 108. These pads subsequently can be used to detect the generation of voltage upon any deformation of piezoelectric element 110. Piezoelectric element 110 and the two electrodes 106 and 108 together form the pressure sensitive junction. Voltmeter or voltage source 114 can be attached to contact pads 116 and 118.

A pressure sensitive junction can be a piezoelectric junction or a piezoresistive junction or a capacitive junction. A piezoelectric junction generates an electromotive force upon deformation and conversely will become deformed when a voltage is applied. Therefore, it can be used as a force transducer as well as a pressure sensor.

A piezoresistive junction exhibits a change in electrical resistance when the junction is strained. Metal wires are commonly used as piezoresistive strain gauges, with various metals exhibiting different strain sensitivity factors (also known as gauge factors); for example, 6.1 for platinum (as the wire lengthens the resistance increases) to −12.1 for nickel (as the wire lengthens the resistance decreases). Wires must be bonded well to the deforming body in order to obtain accurate measurements. Other materials exhibit piezoresistive effects as well, including some ceramic and conductive polymeric materials, and may be used as force sensors if the strain-resistance dependencies are well characterized.

In electromagnetism and electronics, capacitance is the ability of a capacitor to store energy in an electric field. Capacitance is also a measure of the amount of electric potential energy stored (or separated) for a given electric potential. A common form of energy storage device is a parallel-plate capacitor. In a parallel plate capacitor, capacitance is directly proportional to the surface area of the conductor plates and inversely proportional to the separation distance between the plates. If the charges on the plates are +q and −q, and V gives the voltage between the plates, then the capacitance is given by $C=q/V$. Materials may be configured such that changes in their capacitance can be measured. For example, the configuration can be such that the capacitance of the material is dependent on the distance between two parallel conductive plates, and related to pressure applied to the parallel conductive plates. These are called capacitive junctions. Since the distance between two plates can be affected by a force applied to one or both of them, pressure can in turn be calculated if the properties of the material separating the electrodes are understood. Capacitance can be measured directly using the metal parallel plates as electrodes, since the gap between the plates is proportional to capacitance. Alternatively, a constant alternating current can be applied and the amplitude of the alternating voltage measured, which is proportional to the distance between the capacitor's electrodes.

The pressure sensing/force generating device of the present invention can be printed on a non-planar substrate which has an irregular surface. The irregular surface can be a surface lacking uniformity or symmetry, having an uneven shape, position, or arrangement. For example, an irregular surface could be a surface that has indentations or jagged edges. Alternatively, the pressure sensing/force generating device of the present invention has a non-planar substrate which is flexible.

The pressure sensing/force generating device of the present invention further comprises electrical connectors electrically coupled to said first and second printed electrodes. Depending on the design of the pressure sensing/force generating device, these electrical connectors could also be connected to multiple printed elements at multiple locations using the techniques described in the present invention. A person of skill in the art would readily be able to configure the electrical connectors to be suitably connected for different configurations of the pressure sensing/force generating device.

The pressure sensing/force generating device of the present invention further comprises a voltage reader or voltage source operably coupled to the electrical connectors to, respectively, measure or apply voltage between the first and second printed electrodes. Voltage is generated when pressure is applied on the pressure sensitive element or the whole device. This voltage can be calibrated to pressure to provide a direct readout of the applied pressure on the pressure sensitive element or the device. Alternatively, standardized data sets could be provided to convert the voltage reading to pressure.

The pressure sensing/force generating device of the present invention may further comprise an ohmmeter operably coupled to the electrical connectors to measure the resistance between the first and second printed electrodes. For example, if the pressure sensitive junction is made of piezoresistive material, then, upon application of pressure, the electrical resistance of the material will change thereby eliciting a response from the coupled ohmmeter. This resistance measurement can be calibrated to the pressure applied and used to generate standardized data sets. These data sets could then be used to provide a direct readout of the pressure applied on the pressure sensitive element or the device.

The pressure sensing/force generating device of the present invention may further comprise an instrument to measure capacitance operably coupled to the electrical connectors to measure the capacitance between the first and second printed electrodes. For example, if the pressure sensitive junction is made of dielectric material, then, upon application of pressure, the capacitance of the material will change thereby eliciting a response from the coupled instrument. This capacitance measurement can be calibrated to the pressure applied and used to generate standardized data sets. These data sets could then be used to provide a direct readout of the pressure applied on the pressure sensitive element or the device.

In one embodiment, the pressure sensing/force generating device of the present invention comprises an overcoat layer covering the pressure sensitive junction. This overcoat layer can protect the pressure sensitive junction from harsh chemical or physical environments, provide additional mechanical stability to the junction, and can be used to dispose other devices on top of the pressure sensitive junction.

The pressure sensing/force generating device of the present invention can comprise an intermediate layer covering the pressure sensitive junction. The intermediate layer can function as a sealing layer, an insulating layer, an adhesive layer, a structural support layer, or a combination thereof.

The substrate or substrate materials on which the elements of the pressure sensitive junction are printed may be non-conducting or coated with a non-conducting material. The steps of applying the overcoat or intermediate layer materials are useful in fully or partially covering various elements of the pressure sensitive junction depending upon the needs of the junction design.

Suitable materials for use in making the substrates, overcoat layers, and intermediate layers of the present invention include the following polymeric materials: epoxy, polyacrylate, natural rubber, polyester, polyethylene napthalate, polypropylene, polystyrene, polyvinyl fluoride ethyl-vinyl acetate, ethylene acrylic acid, acetyl polymer, poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polytetrafluoroethylene, polyethylene terephthalate, polyhydroxyalkanoate, poly(p-xylylene), liquid crystal polymer, polymethylmethacrylate, polyhydroxyethylmethacrylate, polylactic acid, polyhydroxyvalerate, polyphosphazene, poly($\in$-caprolactone), and mixtures or copolymers thereof.

The pressure sensing/force generating device of the present invention comprises a pressure sensitive element. This pressure sensitive element further comprises piezoactive material containing ink composition or a dielectric material containing ink composition. The piezoactive material can be either piezoelectric or piezoresistive.

Piezoelectric materials generate an electromotive force upon deformation and conversely will become deformed when a voltage is applied. Therefore, they can be used as force transducers as well as force sensors. Many materials exhibit piezoelectric properties. Crystalline ceramics with perovskite structures are among the most prevalently used, including barium titanate, lead zirconate titanate and lead titanate, as well as doped versions of those materials such as strontium-doped barium titanate. Screen printing inks containing such materials are commercially available or may be formulated for low temperature applications if the piezoelectric material particles are readily available. Such materials can also be synthesized by sol-gel methods, in which organometallics or metallic salts are transformed to the appropriate ceramic materials upon exposure to the environment and/or application of shear. Since sol-gel dispersions are commonly available as liquids, they can also be useful printing inks.

Certain polymeric materials also exhibit strong piezoelectric effects. Polyvinylidene fluoride (PVDF) is a particularly well known example as are its copolymers with hexafluoropropylene (PVDF-HFP) or trifluoroethylene (PVDF-TrFE). Copolymers of vinylidene fluoride with other monomers have also been demonstrated to have piezoelectric responses, as have terpolymers containing PVDF. In addition, odd-numbered polyamides such as Nylon 9 and Nylon 11, as well as other synthetic and naturally occurring macromolecules, demonstrate piezoelectric activity. Various additives, including salts, have been shown to amplify the piezoelectric strength of such polymers by influencing the crystal structure. Such polymers can be formulated into inks by dissolution or suspension in appropriate vehicles. Specific processing conditions such as solvent selection, cooling or drying rates, and induced strain during formation, have also been demonstrated to influence piezoelectric response, because of influences on the crystallinity.

Piezoresistive materials exhibit a change in electrical resistance due to applied mechanical stress. The piezoresistive materials differ from piezoelectric materials in that the piezoresistive materials only exhibit a change in resistance and do not produce an electric potential upon application of stress.

A common class of piezoresistive materials are composites containing a dielectric binder (typically a flexible polymer) and a conductive filler particle, such carbon or a metal. When the composite is bent or strained, the particles experience changes in particle to particle contact, resulting in changes in resistance of the material.

In the case of piezoresistive inks, one would add particles providing a piezoresistive response, such as carbon or metals including but not limited to tungsten, silver, nickel, copper or alloys. Conductive ceramic particles may also be added to provide a piezoresistive signal. Doped perovskites, zinc oxide, vanadium pentoxide, tin oxide and others may be used as long as they are available in a useful particulate form. Conductive polymers may be used alone or in combination with a polymeric binder. Examples of polymers which may be used in this way include, for example, polypyrrole, polyaniline and polyethylenedioxythiophene and their derivatives.

To formulate a piezoelectric ink, ferroelectric polymers may be used alone or in combination with other polymeric binders. Common piezoelectric polymers include polyvinylidene fluoride and its copolymers, and polyamide.

If a piezoelectric ceramic is used, suitable particles must be obtained. Lead zirconate titanate is the most commonly used material, but other materials may be obtained in particle form and effectively used as well, including lead titanate, barium titanate, bismuth titanate, strontium titanate, lithium niobate, potassium niobate, lithium tantalate, zinc oxide, quartz, and many others. Another method of obtaining piezoelectric ceramics is to utilize appropriate salts or metallorganics and heat treat them to obtain the proper materials. For example, barium hydroxide and titanium isopropoxide have been combined to form barium titanate. Similarly, lead acetate, zirconium isoporoxide and titanium isopropoxide can be combined and annealed to form piezoelectric lead zirconate titanate. Generally, such approaches require such high temperatures that they are not as useful in deposition onto polymeric surfaces as dispersion of pre-made ceramic particles in a polymeric matrix are.

Another common approach is to combine a piezoelectric polymer, acting as a binder, with a piezoelectric ceramic.

Piezoresistive materials generally do not require any special conditioning treatment to render them responsive to mechanical input. However, piezoelectric materials must be poled, or polarized (i.e. their dipole moments aligned in a single direction) in order to become useful. In order to achieve this, a voltage is applied across the piezoelectric material. Poling becomes more effective if the voltage is applied near the Curie temperature of the material and held as the material is cooled back to room temperature. Therefore, if a piezoelectric material is to be integrated on the surface of a polymeric substrate which cannot tolerate particularly high temperatures, the material should be selected from those with relatively low Curie temperatures. The disadvantage of doing so is that the risk of depolarization under ambient conditions rises. However, many materials are available that can provide a robust working range coinciding with temperatures normally encountered in medical devices. Another important factor in the effectiveness of the poling process is the voltage applied per unit thickness of the piezoelectric material. Therefore, thinner layers of material are poled more effectively. This attribute is also desirable in constraining the piezoelectric sensor to protrude as little as possible from the substrate surface to avoid tissue damage. This polarization process can be accomplished in some cases by careful control over crystallization, such that specific annealing conditions or stretching of polymeric piezoelectric materials may result in poled material. However, in direct write applications, piezoelectric ceramic particles are typically present as small particles dispersed in a matrix having a random dipole moment resulting in a net zero piezoelectric response. When these materials are deposited on a polymeric substrate, it is generally impossible to anneal them at high enough temperatures to affect the crystal structure itself. Instead, an electric field must be applied through the printed area to polarize the material. In most cases, slightly elevated temperatures are required to optimize the poling process, but some limited polarization will occur in certain materials even at room temperature. In the case of polymeric piezoelectric materials, polarizability is affected by the crystal structure of the polymer. With careful consideration of solvent selection and drying rates, the material can be subsequently poled by applying an electric field at a fairly low temperature.

Capacitors are widely used in electronic circuits for blocking direct current while allowing alternating current to pass, in filter networks, for smoothing the output of power supplies, in the resonant circuits that tune radios to particular frequencies, and for many other purposes. The capacitance is greatest when there is a narrow separation between large areas of conductor, hence capacitor conductors are often called "plates," referring to an early means of construction. In practice, the dielectric between the plates passes a small amount of leakage current and also has an electric field strength limit, resulting in a breakdown voltage, while the conductors and leads introduce an undesired inductance and resistance. The material between the electrodes can be formed of any number of materials, as long as it deforms adequately under the range of pressures of interest. It can be formed of a gas, such as air, if the expected applied pressures are particularly small. Generally, it is preferable to maximize dielectric constant and minimize compressive modulus in order to maximize the sensitivity and output signal. Polymers typically exhibit a low modulus and ease of fabrication, so they are often used, but they suffer from a relatively low dielectric constant. They may be rendered even more compliant by introduction of voids, using well known methods of forming foams or membranes, including solvent-nonsolvent casting approaches, addition of second soluble phases and subsequent removal, foaming by direct incorporation of gas via agitation, or formation of gas via reactive substances during the polymer casting and drying process. Ceramic materials, in particular those with perovskite crystal structures, exhibit very high dielectric constants, yielding generally higher values of capacitance. While they are often too stiff to be used effectively in displacement based capacitive sensors, to the extent that they are available as particulates, they can be directly incorporated into softer polymer layers as a second phase, raising the overall dielectric constant and capacitance of the layer. In order that the device can be used repeatedly, it is preferred that any deformation be reversible.

The dielectric materials of the present invention can be selected from materials which deform under the applied pressures to the extent that a measurable change in capacitance occurs as a result of the surrounding electrodes' change in separation distance. However, the dielectric layer should not be so compressible or weak that that the electrodes can touch or otherwise break through the dielectric layer separating them when force is applied. For most pressures of interest, such a material is generally a polymer. Examples of particularly useful and common polymers which satisfy these requirements and are easily dispensed into a continuous layer include polyurethanes, styrene-butadiene copolymers, acrylonitrile-styrene-butadiene terpolymers, silicones, polyacrylates, epoxies, polyvinyl chloride and derivatives or mixtures thereof. Foams or other composites of such polymers are also useful and allow more precise design of dielectric and mechanical properties. Plasticizers may also be added to adjust the mechanical properties of the polymer such that the capacitive response falls within the desired range for the specific application.

The pressure sensing/force generating device comprises conductive ink compositions which are able to conduct electricity. These ink compositions can comprise materials such as various metals, for example, copper, silver, gold, palladium, platinum, nickel. These ink compositions can also comprise materials such as various forms of conductive carbon (e.g., graphite or carbon black), conductive ceramics (e.g., tin oxide, vanadium pentoxide, doped versions of the tin oxide, or doped versions of vanadium oxide), conducting polymers (e.g., polypyrrole, polythiophene, or polyaniline). The conductive inks can also include various combinations, mixtures, or copolymers of the above mentioned materials.

Conductive polymers may be used in the conductive inks, alone or in combination with a polymeric binder to provide a piezoresistive response or capacitance. Examples of polymers which may be used in this way include polypyrrole, polyaniline, and polyethylenedioxythiophene, and their derivatives. For example, a piezoelectric ink can be formed by using ferroelectric polymers alone or in combination with other polymeric binders. Common piezoelectric polymers include polyvinylidene fluoride and its copolymers, polyamide.

Another common approach to making conductive ink is to combine a piezoelectric or capacitive polymer, acting as a binder, with a piezoelectric ceramic or dielectric material. Screen printing inks containing such materials are commercially available, or may be formulated for low temperature applications if the piezoelectric material particles are readily available. Such materials can also be synthesized by sol-gel methods, as described supra.

Additives and fillers can often be present in the ink compositions of the present invention in order to improve mechanical or electrical properties, enable processing, and add radiopacity to devices. The surface of the polymer may be further modified to enhance biocompatibility or to alter frictional or adhesive properties through the application of: additional polymeric, oligomeric, or surfactant coating layers or materials; mechanical or chemical etching; or plasma, corona or flame treatment. Various additives, including salts, have been shown to amplify the piezoelectric strength of such polymers by influencing the crystal structure.

The conductive ink composition can include a binder selected from the group consisting of poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polyethylene, polytetrafluoroethylene, polyethylene terephthalate, polyhydroxyalkanoate, poly(p-xylylene), liquid crystal polymer, polymethylmethacrylate, polyhydroxyethylmethacrylate, polylactide, polyglycolide, polyisoprene, poly($\in$-caprolactone), cyanoacrylates, polyvinyl butyral, polyvinyl formal, polyethylene oxide, polyvinyl alcohol, polyvinylpyrrolidone, cellulose esters, cellulose ethers, carrageenan, gelatin, chitosan, and combinations or copolymers thereof. Blends of such polymers can be especially helpful in optimizing mechanical and adhesive properties. They may also play a role in providing a reliable dispersion of the metal particles or in adjusting the rheological characteristics of the ink.

In order to ensure good adhesion to the polymeric substrate and adequate mechanical properties of the printed trace itself, the ink can comprise a polymeric binder combined with a sufficient level of conductive particles to afford contiguous contact of the particles in the dry form. The polymeric binder may be any of the commonly available thermoplastic or thermoset polymers, or combinations thereof. The polymer may be dissolved or dispersed in an organic solvent which also may play a role in enhancing adhesion to the substrate device. Additives may be present in the ink or paste, including but not limited to crosslinkers, catalysts, inhibitors, dispersants, surfactants, thickeners, and matting agents. For a silicone medical device, for example, the optimal binder polymer may comprise polydimethylsiloxane, along with appropriate crosslinking chemistry to yield a sufficiently robust matrix for the metal particles. For a poly(vinyl chloride) substrate medical device, an optimal binder polymer for the printing ink may be poly(vinyl chloride) dissolved in a solvent which slightly swells the substrate to allow entanglement of the ink polymer and the substrate polymer, leading to optimal adhesion.

Solvents which may be used in the present invention include any liquid capable of dissolving or dispersing the ink binder polymer, such as paraffinic hydrocarbons such as cyclohexane; aromatic hydrocarbons such as toluene or xylene; halohydrocarbons such as methylene dichloride; ethers such as anisole or tetrahydrofuran; ketones such as acetone, methyl ethyl ketone or methyl isobutyl ketone; aldehydes; esters such as ethyl carbonate, 4-butyrolactone, 2-ethoxyethy acetate or ethyl cinnamate; nitrogen-containing compounds such as n-methyl-2-pyrrolidone or dimethylformamide; sulfur-containing compounds such as dimethyl sulfoxide; acid halides and anhydrides; alcohols such as ethylene glycol monobutyl ether, a-terpineol, ethanol, or isopropanol; polyhydric alcohols such as glycerol or ethylene glycol; phenols; or water or mixtures thereof. The binder polymer may also be present as an undissolved dispersion, or polymer latex, suspended in water.

Preferred solvents are those which have the lowest toxic potential when left behind in residual quantities, such as acetone, 1-butanol, ethanol, 1-propanol, methyl acetate, anisole, methyl acetate, methyl ethyl ketone, and the like. Combinations of solvents sometimes prove especially useful in obtaining good solubility with minimal risk of toxicity. It is preferable to choose solvents which evaporate at a rate such that the temperature of the polymeric substrate can be maintained below its softening point. As a result, the device is not damaged as the solvent is driven off.

The pressure sensing/force generating device of the present invention may comprise first and second printed electrodes and printed pressure sensitive element which collectively have a thickness of 1 to 500 microns. In one embodiment, the first and second printed electrodes and the printed pressure sensitive element collectively have a thickness of 20 to 100 microns.

The pressure sensing/force generating device of the present invention can comprise a plurality of the pressure sensitive junctions. A plurality of pressure sensitive junctions may be used to increase the area over which the pressure measurements are taken. A plurality of junctions could also be connected in series such that the generated signals are additive and thus easier to detect. Also, multiple printed pressure sensitive junctions can be disposed at multiple locations on a medical device. This allows the gathering of pressure information or enables generation of force at multiple points over a region of the medical device. The positions of the printed pressure sensitive junctions, the materials used to form the printed pressure sensitive junctions, and the electrical and mechanical topology of the junctions can all be varied according to the needs of a particular application.

Another aspect the present invention relates to a medical device comprising the pressure sensing/force generating device of the present invention. For example, the medical device could be a three-dimensional polymeric medical device having a functional pressure sensor or force generator applied directly and permanently to its surface by an industrial printing or direct-writing technique.

Medical devices are generally defined by the United States Food and Drug Administration as "an instrument, apparatus, implement, machine, contrivance, implant, in vitro reagent, or other similar or related article, including a component part, or accessory which is: 1) recognized in the official National Formulary, or the United States Pharmacopoeia, or any supplement to them; 2) intended for use in the diagnosis of disease or other conditions, or in the cure, mitigation, treatment, or prevention of disease, in man or other animals; or 3) intended to affect the structure or any function of the body of man or other animals, and which does not achieve any of it's primary intended purposes through chemical action within or on the body of man or other animals and which is not dependent upon being metabolized for the achievement of any of its primary intended purposes."

There are many uses of force sensors and transducers in medicine. By applying the device directly to the surface of a medical device, its location is well defined, while issues related to attachment of electronics or sharp edges resulting from protrusion of the active materials is not an issue.

For example, pressure sensors can be used as ultrasonic sensors or transducers during diagnostic procedures, or as ultrasonic transducers for use in sonoporation (enablement of drug delivery using ultrasonic energy). Pressure sensors applied to medical devices may also be used to monitor blood pressure, airway pressure, intraocular pressure or pressure of any number of biological fluids. During cryoablation procedures, it is desirable to maintain a predetermined pressure at the catheter tip in order to maximize the refrigeration potential of the refrigerant fluid at the tip. Still another application of force-sensitive materials is to detect lesions, which are typically less elastic than surrounding tissue or to distinguish between lesion types, since cancerous lesions are normally less compressible than other types of lesions. Such materials can also be used as tactile sensors positioned on artificial limbs. A further use of force sensors in a biological setting are as cantilever biosensors. In these devices, an additional layer of material exhibiting selectivity to the species of interest is positioned on a piezoactive microcantilever, and changes in effective weight or surface deformation are detected as bending of the cantilever or, alternatively, as changes in the resonant frequency of the cantilever. Piezoactive materials may also be used in cochlear implants, to sense and transform mechanical signals originating from sound waves to electrical signals. Such signals may then be processed and transformed back to mechanical vibrations targeted at the appropriate organs, generally the stapes and the cochlea. Piezoactive materials may also act as accelerometers by having a mass fixed on their free surface which responds to sudden changes in motion. Such an instrument could be useful in detecting a patient falling or exhibiting other undesirable lurching movements. Piezoelectric materials may also be positioned and utilized to harvest energy generated from natural motion, which can then be stored and used to power other functionalities on a medical or therapeutic device.

The medical device of the present invention can comprise a plurality of the pressure sensitive junctions. The medical device of the present invention can be operably connected or coupled to another device to control or monitor the another device's function. This secondary device which is being controlled by the medical device of the present invention can be, for example, transducers to transmit electromagnetic fields, electromagnetic energy, heat, light, force, pressure, or medicaments to body tissues; sensors to detect electromagnetic fields, electromagnetic energy, light, force, pressure, pathogens, chemical species, or biological entities. Secondary functional devices can be in close proximity to the pressure sensing/force generating device such that they can communicate electrically. The presence or absence of any secondary devices, coatings, or other functional elements on the medical device is coincidental to the present invention.

The medical devices of the present invention include, but are not limited to, endotracheal tubes, endobronchial tubes, cannulae, catheters, balloons, stents, airways, sensors, stimulators, implants, intraocular or contact lenses, cochlear implants, and orthopedic implants or prostheses. Sensors can include sensing capsules, stimulators, and the like. While drug-eluting stents or other drug-eluting devices do not strictly conform to the definition above, they are considered primarily as medical devices and, therefore, are encompassed by the present invention.

In another aspect, the present invention relates to a method of forming a pressure sensing/force generating device. The method comprises providing a non-planar substrate and applying a pressure sensitive junction to the non-planar substrate. The pressure sensitive junction comprises (a) a printed pressure sensitive element capable of producing a piezoelectric/piezoresistive effect and comprising a piezoactive material containing ink composition and/or (b) a printed pressure sensitive element capable of producing a capacitive effect and comprising a dielectric material containing ink composition. The pressure sensing/force generating device also includes a first printed electrode comprising a conductive ink composition, and a second printed electrode comprising a conductive ink composition. The first and second electrodes are in electrical contact with the printed pressure sensitive element to collectively form the pressure sensitive junction.

Figure 2:
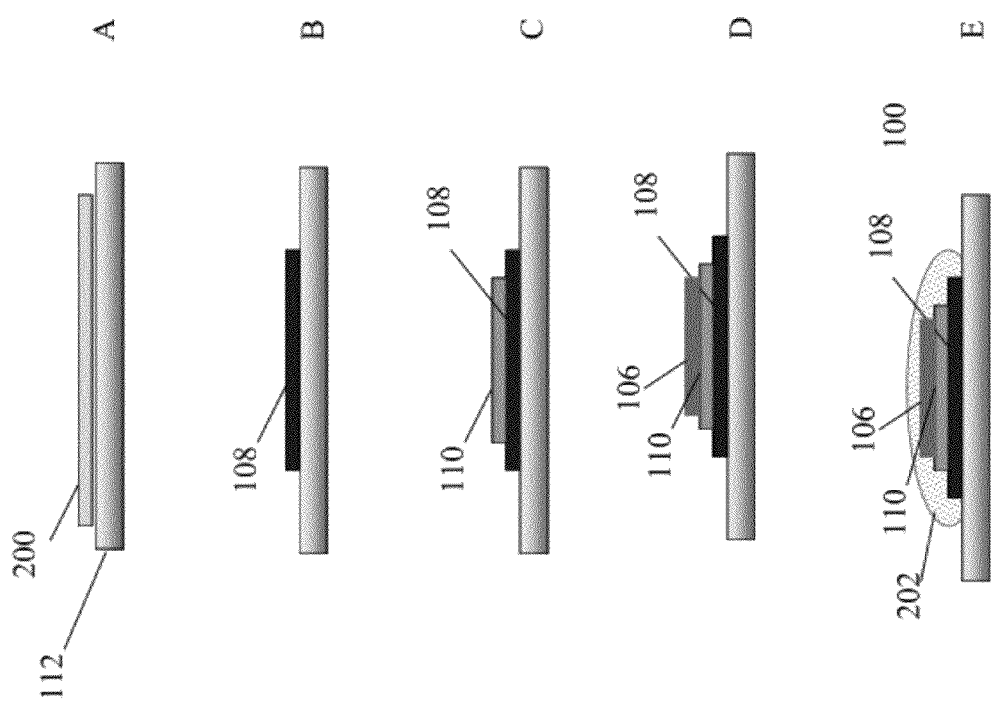
FIGS. 2A-E show cross-sectional views of the sequential fabrication steps that may be used in constructing a piezoelectric device of the present invention. The views are shown along section AA in FIG. 1.

FIG. 2 illustrates one example of a fabrication sequence for piezoelectric device 100. FIG. 2A depicts the application of intermediate layer 200, which is omitted in FIG. 1. Intermediate layer 200 is an optional layer which may be used, for example, to improve adhesion between medical device substrate 112 and the electrodes and piezoelectric materials, to provide additional stiffening if the medical device substrate 112 proves too flexible to adequately support the piezoelectric device, and to provide electric isolation if medical device substrate 112 possesses an electronic or ionic conductivity such that it interferes with the proper functioning of the piezoelectric device 100. Note that for simplicity of presentation, the presence of intermediate layer 200 is omitted in the remainder of FIG. 2. FIG. 2B shows first printed electrode 108 is disposed on medical device substrate 112. Electrode 108 extends to lead 104 (not shown in FIG. 2). FIG. 2C shows piezoelectric material 110 is deposited over first printed electrode 108. A small tab of material 110 (not shown in FIG. 2) should extend over a section of the edge of electrode 108 in order to provide an insulating path for subsequent electrode lead 102 (not shown in FIG. 2C). In FIG. 2D, second printed electrode 106 is deposited over piezoelectric material 110. Electrode 106 is connected to lead 102. It should be noted that piezoelectric layer 110 is only active and useful in the area positioned entirely between electrodes 106 and 108. As a result, in FIG. 2, this active area would only be in the areas of piezoelectric layer 110 which lie directly beneath top electrode 106. In FIG. 2E, optional printed trace overcoat 202 is a dielectric layer disposed over the piezoelectric material 110 electrodes 106 and 108, and, optionally, leads 102, and 104.

Overcoat 202 does not, however, extend over first and second contact pads 116 and 118. Printed trace overcoat 202 protects the printed elements from ions, moisture, and friction and provides support against stress. Printed trace overcoat 202 can also be used as a means of enhancing flexibility and providing support to the device, as well as ensuring that any irritation or toxicity inherent to the ink used or its binder is isolated from the body tissues. Printed trace overcoat 202 may contain additives that impart desirable properties such as radiopacity, lubricity, or release of medicaments. Any biocompatible, non-conductive, impermeable polymer which is easily applied may be used (e.g., medical grade silicones, such as those provided by NuSil® (Bakersfield, Calif.), or medical grade acrylate adhesives, such as those provided by Dymax® (Torrington, Conn.)).

There are many ways in which the pressure sensitive junction can be applied to the non-planar surface and are included in the present invention.

In one embodiment, the pressure sensitive junction is applied by applying the printed pressure sensor element to the non-planar substrate, applying the first printed electrode to the printed pressure sensor element, and applying the second printed electrode to the printed pressure sensor element.

In another embodiment, the pressure sensitive junction is applied by applying the first printed electrode to the non-planar substrate, applying the printed pressure sensor element to the first printed electrode, and applying the second printed electrode to the printed pressure sensor element.

In a further embodiment, the pressure sensitive junction is applied by applying the first printed electrode to the non-planar substrate, applying the second printed element to the non-planar substrate, and applying the printed pressure sensor element such that it is in electrical contact with the first and the second printed electrode.

In yet another embodiment, the pressure sensitive junction is applied by applying the first printed electrode to the non-planar substrate, applying the printed pressure sensor element to the non-planar substrate such that it is in electrical contact with the first printed electrode, and applying the second printed electrode to the printed pressure sensor element.

The applying steps can be carried out by direct writing. Many direct writing techniques that satisfactorily control and manipulate, for example, a three dimensional, irregular substrate may be used. These include screen printing, jetting, laser ablation, direct writing, or pressure driven syringe delivery, inkjet or aerosol jet droplet based deposition, laser or ion-beam material transfer, tip based deposition techniques such as dip pen lithography, or flow-based microdispensing (e.g., Micropen [Micropen Technologies Corp., Honeoye Falls, N.Y.] or NScrypt® technologies). Such techniques are well described in Pique et al., *Direct-Write Technologies for Rapid Prototyping Applications: Sensors, Electronics, and Integrated Power Sources*, Academic Press (2002).

Microdispensing techniques such as Micropen direct writing are particularly preferred for marking of medical devices, due to their ability to accommodate inks having an extremely wide range of rheological properties and very high solids levels, as well as excellent three dimensional substrate manipulation capabilities. To form the pressure sensing/force generating devices of the present invention on surfaces, a Micropen® device can be used to apply the lines of the two or more selected inks or paints such that they form the pressure sensitive junction. These lines can then be extended to a convenient area where the extension conductors can be attached to connect the pressure sensitive junctions and instrumentation.

This technique is especially suitable for flexible objects, because the writing force is continuously adjusted to compensate for substrate morphology. A major advantage of using a microdispensing technique to write the pressure sensing/force generating device is that the tip of the pen does not come in direct contact with the substrate during the writing process. This makes it a preferable method for writing the piezoactive element and the first and second elements, because no distortion of the substrate is expected during the writing process.

Figure 3:
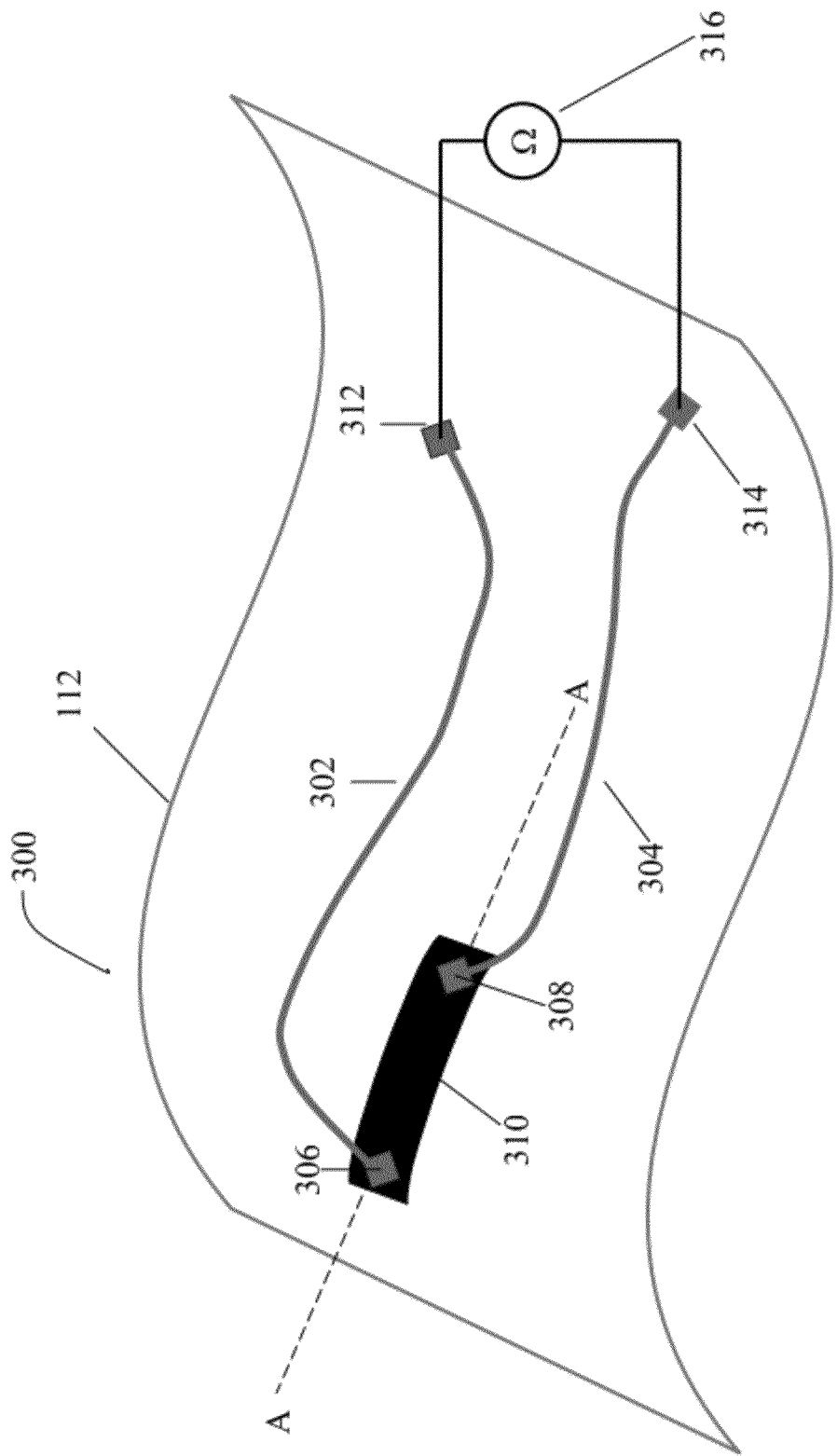
FIG. 3 shows a perspective view of an embodiment of the piezoresistive device of the present invention disposed on a non-planar medical device substrate.

FIG. 3 shows a piezoresistive device 300 with two electrical leads, 302 and 304, leading to first and second printed electrodes 306 and 308, respectively. Electrodes 306 and 308 are positioned on either end of piezoresistive element 310. Electrodes 306 and 308 may be chosen from the same or different materials, as long as they are sufficiently conductive. The device is disposed on medical device substrate 112, which can be any "three dimensional" medical device as described above. In this construction, piezoresistive layer 310 will produce a change in resistance upon deformation, either by stretching and releasing or by compression. Ohmmeter 316 can be attached to contact pads 312 and 314 to read the change in resistance.

Figure 4:
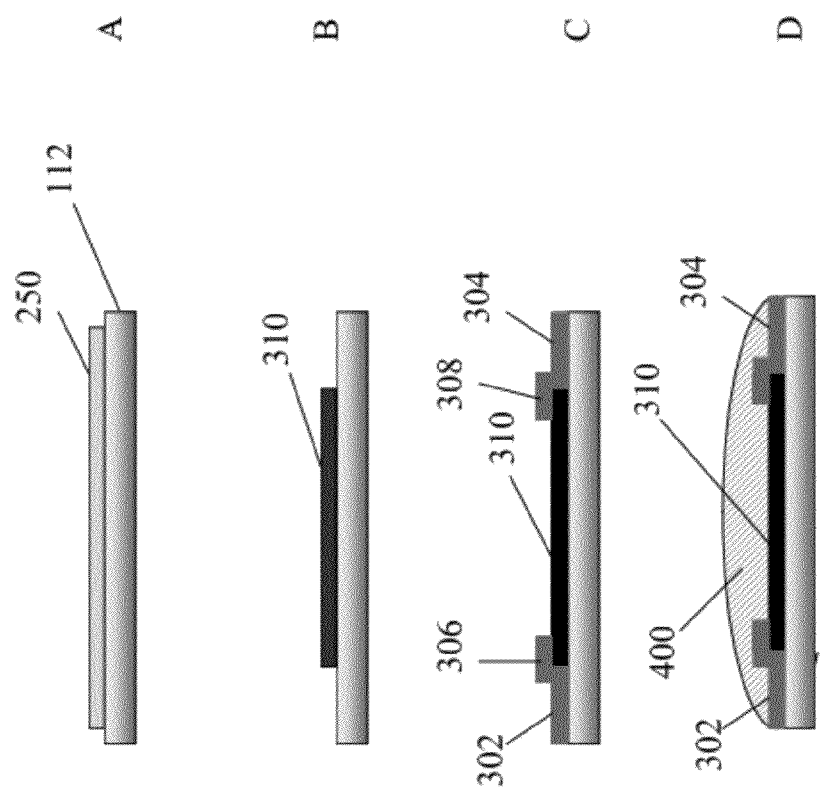
FIGS. 4A-D show cross-sectional views of the sequential fabrication steps that may be used in constructing a device of the present invention. The views are shown along section AA in FIG. 3.

FIG. 4 illustrates the fabrication sequence of piezoresistive device 300. FIG. 4A depicts the application of intermediate layer 250, which is omitted in FIG. 3. Intermediate layer 250 is an optional layer which may be used to improve adhesion between substrate 112 and the electrodes and piezoresistive materials, to provide additional stiffening if medical device substrate 112 proves too flexible to adequately support the piezoresistive device, or to provide electric isolation if medical device substrate 112 possesses an electronic or ionic conductivity which interferes with the proper functioning of piezoresistive device 300. Note that for simplicity of presentation the presence of intermediate layer 200 is omitted in the remainder of FIG. 4. In FIG. 4B, piezoresistive layer 310 is disposed on medical device substrate 112. In FIG. 4C, printed electrodes 306 and 308 are provided on either end of the piezoresistive pad 310. Electrode 306 is connected to lead 302, and electrode 308 is connected to lead 304. In FIG. 4D, optional printed trace overcoat 400 is a dielectric layer disposed over the piezoresistive material 310, electrodes 306 and 308, and, optionally, leads 302 and 304. The overcoat does not, however, extend over the other contact pads, if present, at the ends of the leads. Printed trace overcoat 400 protects the printed elements from ions, moisture and friction, provides support against stress, serves as a means of enhancing flexibility, and provides support to the device. Printed trace overcoat 400 may contain additives that impart desirable properties, such as radio opacity or release of medicaments, and ensures that any irritation or toxicity inherent to the metal or its binder is isolated from the body tissues.

Figure 5:
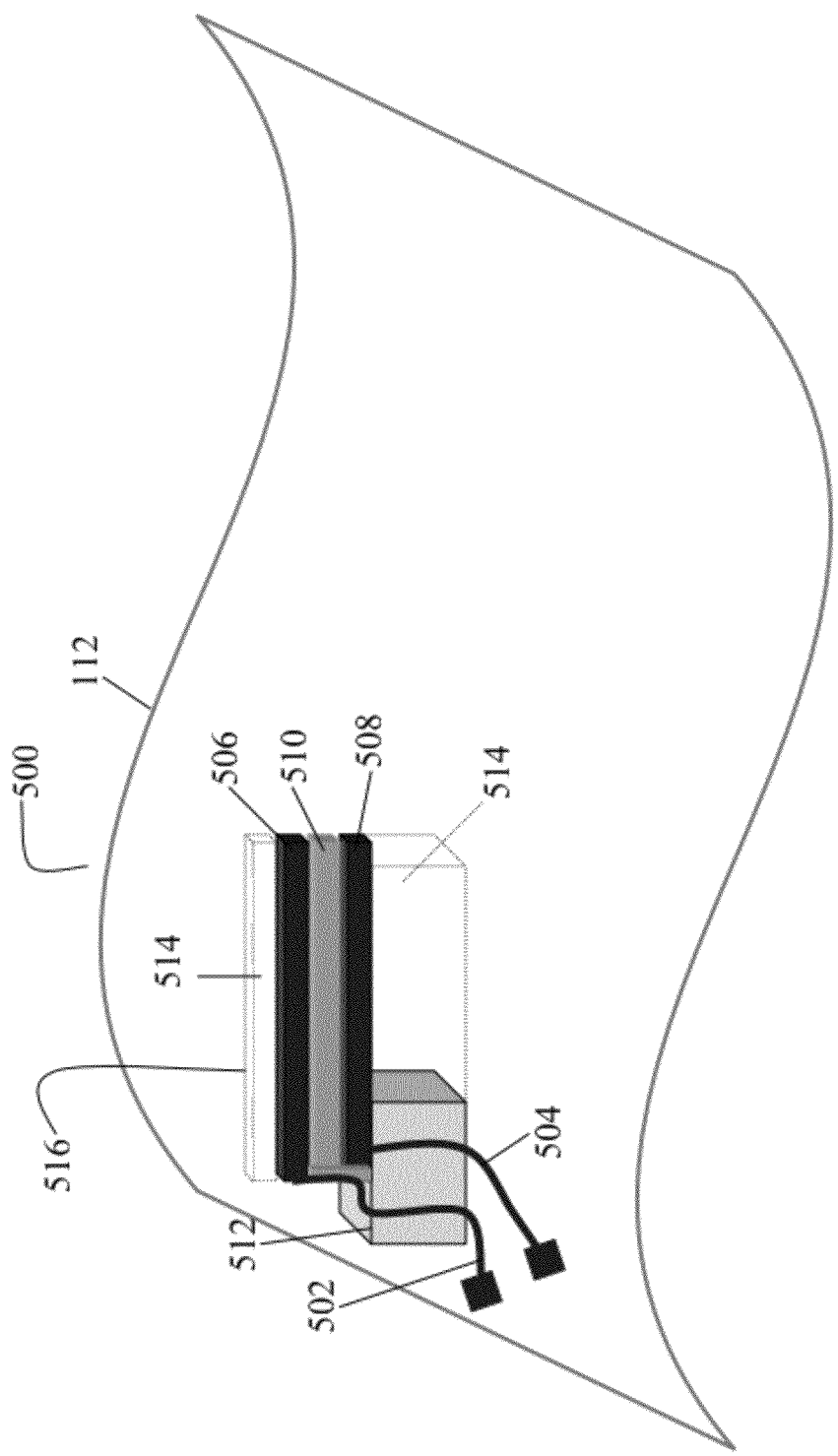
FIG. 5 shows a perspective view of another embodiment of a piezoelectric device of the present invention. This device may be used as a cantilever sensor or a transducer.

The piezoelectric device of the present invention can function as a cantilever sensor or a transducer. FIG. 5 shows a piezoelectric device 500, which can be used as a cantilever sensor or a transducer and includes two electrical leads, 502 and 504, leading to first and second electrodes 506 and 508, respectively. These electrodes sandwich piezoelectric element 510. Electrodes 506 and 508 may be chosen from the same or different materials, as long as they are sufficiently conductive. The device is positioned on dielectric platform 512 which supports the suspended device. This geometry is realized by depositing sacrificial layer 514 directly on the surface of medical device substrate 112, and removing it after the remaining layers of the device are deposited. Convenient methods of removal include peeling, if the layer is selected from materials which do not adhere to support platform 512, medical device substrate 112, or bottom electrode 508. Alternatively, sacrificial layer 514 could be removed by melting, or by dissolving the material in a solvent for layer 514 which is not a solvent for support platform 512, medical device substrate 112, or bottom electrode 504. The device is disposed on medical device substrate 112, which can be any "three dimensional" medical device. In this construction, such piezoelectric element 510 may be effectively and permanently polarized by applying a voltage using pads 506 and 508 and can then be used to detect the generation of voltage due to any deformation of the piezoelectric layer. In the case of cantilever sensing, further layer 516, which has specific binding sites for molecules of interest, could be attached to the top electrode to selectively bind materials which then cause a deformation or change in the resonant frequency of the suspended beam due to their added mass. If the device is not intended for use as a sensor, but rather a transducer, selective layer 516 may be omitted and voltage applied to the structure in order to produce a deformation or vibration. Depending on the materials and geometry selected, such a vibration may be in the ultrasonic range of frequencies, such that the device acts as an ultrasonic transducer.

Figure 6:
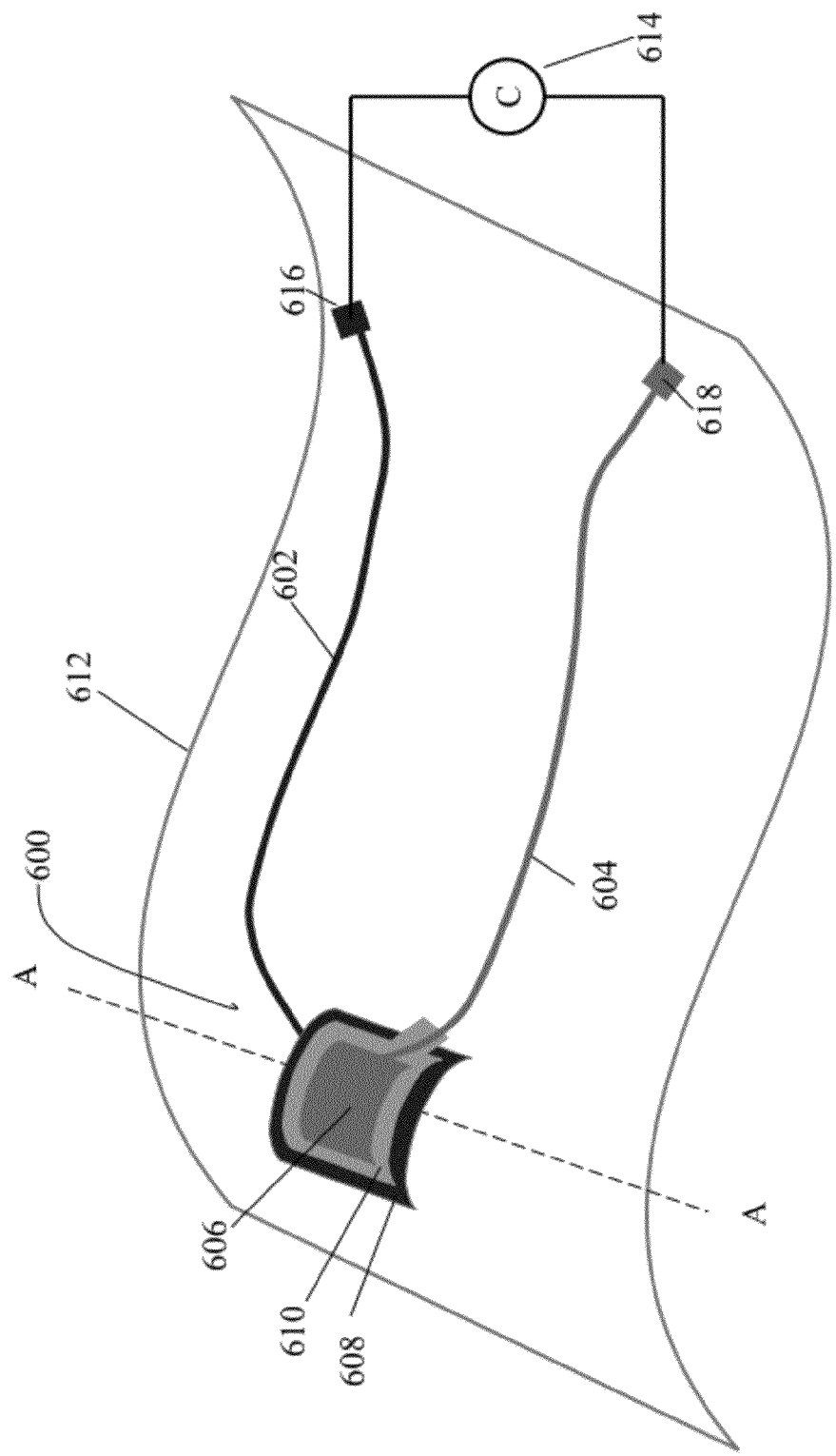
FIG. 6 shows a perspective view of one embodiment of a pressure sensitive capacitive device of the present invention disposed on a non-planar medical device substrate.

Referring now to FIG. 6, capacitive pressure sensitive device 600 has two electrical leads, 602 and 604, leading to first and second electrodes 608 and 606, respectively. These electrodes sandwich a capacitive pressure sensing element 610. Electrodes 602 and 604 may be chosen from the same or different materials, as long as they are sufficiently electrically conductive. The device is disposed on a medical device substrate 612, which can be any "three dimensional" medical device. In this device, such a capacitive pressure sensitive element 610 may be effectively and permanently deformed by applying a force or pressure to the top surface electrode 606, such that capacitive pressure sensing element 610 is deformed. These pads subsequently can be used to detect a change in capacitance upon any compression of pressure sensitive element 610. A capacitance measuring device 614 can be attached to contact pads 616 and 618.

FIG. 7 illustrates one example of a fabrication sequence for capacitive pressure sensitive device 600. FIG. 7A depicts the application of intermediate layer 700, which is omitted in FIG. 6. Intermediate layer 700 is an optional layer which may be used, for example, to improve adhesion between medical device substrate 612 and the electrodes and compressive materials, to provide additional stiffening if the medical device substrate 612 proves too flexible to adequately support capacitive pressure sensitive device 600, and to provide electric isolation if medical device substrate 612 possesses an electronic or ionic conductivity such that it interferes with the proper functioning of capacitive pressure sensitive device 600. Note that for simplicity of presentation, the presence of intermediate layer 700 is omitted in the remainder of FIG. 7. FIG. 7B shows first printed electrode 608 disposed on medical device substrate 612. Electrode 608 extends to lead 604 (not shown in FIG. 7B). FIG. 7C shows capacitive pressure sensing element 610 deposited over first printed electrode 608. A small tab of material 610 (not shown in FIG. 7) should extend over a section of the edge of electrode 608 in order to provide an insulating path for subsequent electrode lead 602 (not shown in FIG. 7C). In FIG. 7D, second printed electrode 606 is deposited over compressive material 610. Electrode 606 is connected to lead 602. In FIG. 7E, optional printed trace overcoat 702 is a dielectric layer disposed over the compressive material 610, electrodes 606 and 608, and, optionally, over leads 602 and 604. Overcoat 702 does not, however, extend over first and second contact pads 616 and 618. Printed trace overcoat 702 protects the printed elements from ions, moisture, and friction and provides support against stress. Printed trace overcoat 702 can also be used as a means of enhancing flexibility and providing support to the device, as well as ensuring that any irritation or toxicity inherent to the ink used or its binder is isolated from the body tissues. Printed trace overcoat 702 may contain additives that impart desirable properties such as radiopacity, lubricity, or release of medicaments. Any biocompatible, non-conductive, impermeable polymer which is easily applied may be used (e.g., medical grade silicones, such as those provided by NuSil® (Bakersfield, Calif.), or medical grade acrylate adhesives, such as those provided by Dymax® (Torrington, Conn.)).

The present invention is illustrated, but not limited, by the following examples.

EXAMPLES

Example 1

Piezoelectric Polymer Pressure Sensor on an Endotracheal Tube

Silver ink was prepared by dissolving poly(vinyl chloride) (Colorite® Flexchem 5051-02) at a level of 16.7% by weight in cyclohexanone. Silver flake (10 µm, >99.9%, Sigma-Aldrich) was added to yield a ratio of silver:poly(vinyl chloride) of 90:10. The total solids were 68% by weight. In order to enable thorough mixing, the materials were combined using a planetary high shear mixer (Kurabo Mazerustar KK-50S).

Piezoelectric polymeric ink was prepared by dissolving a polyvinylidene fluoride-trifuoroethylene (PVDF-TrFE) copolymer (75:25 mole ratio; Kynar copolymer, Measurement Specialties Inc) in n-methyl pyrrolidone to make a 30% solution.

Using the silver ink, a bottom electrode and lead were written on a commercially available standard endotracheal tube (Unomedical Air Management, Magill, HVLP cuff) and cured at 100° C. for 30 minutes. Then, three layers of the piezoelectric polymer were written onto the surface of the bottom electrode, with a brief pause between each layer and then a final curing of 80° C. for 30 minutes. This sequence was adopted to prevent cracking in the PVDF-TrFE layer. The total thickness of the dried polymer layer was estimated to be approximately 25 µm. Finally, a top silver electrode and lead were written on the surface of the piezoelectric layer and cured for another 30 minutes at 80° C. Wires were attached to the leads using the silver ink, and the polymer was poled by applying 52V for 1 hour at 100° C. The voltage was maintained as the sample cooled to room temperature for an additional 45 minutes.

After poling, it was observed that the piezoelectric material on the tube produced a voltage in excess of 25 mV when the tube was flexed.

Example 2

Piezoelectric Polymer Pressure Sensor on Cuff with Overcoat

A PVDF-TrFE piezoactive layer with top and bottom electrodes was prepared in a manner identical to Example 1, except that it was positioned on the cuff of the endotracheal tube and was covered with a UV-curable medical polymeric encapsulant (Dymax 1-20323; Dymax Corporation) which was subsequently cured via ultraviolet irradiation.

Example 3

Piezoelectric Ceramic Pressure Sensor on Tube

A piezoelectric sensor with electrodes was prepared identically to Example 1, except that the piezoelectric material was $BaTiO_3$. The $BaTiO_3$ ink was prepared by dissolving poly(vinyl chloride) (high molecular weight, Aldrich) at a level of 13% by weight in dimethylacetamide, and adding $BaTiO_3$ particulate (Barium titanate (IV), <3 mm, 99%; Sigma-Aldrich) such that the weight ratio of poly(vinyl chloride)::$BaTiO_3$ was 31.25:68.75 and the total solids were 30.1% by weight. The ink was deposited in two layers and each layer was cured at 80° C. for 30 minutes to yield a total thickness of approximately 12 µm.

The sample was connected and poled identically to Example 1, and exhibited a piezoelectric response of about 20 mV when flexed.

Example 4

Piezoelectric Ceramic Pressure Sensor on Tube

A piezoelectric sensor with electrodes was prepared identically to Example 1, except that the piezoelectric material was lead zirconate titanate (PZT). The PZT ink was prepared by dissolving poly(vinyl chloride) (high molecular weight, Aldrich) at a level of 13% by weight in dimethylacetamide, and adding PZT particulate (NCE55, Noliac Ceramics s.r.o.) such that the weight ratio of poly(vinyl chloride):PZT was 31.25:68.75 and the total solids were 30.1% by weight. The ink was deposited in two layers and each layer was cured at 80° C. for 30 minutes to yield a total thickness of approximately 12 µm.

The sample was connected and poled identically to Example 1, except the poling temperature was 120° C. The structure exhibited a piezoelectric response of about 10 mV when flexed.

Example 5

Piezoresistive Sensor on Tube

A piezoresistive sensor was prepared on the surface of an endotracheal tube, by first writing a thin adhesion promoting layer or intermediate layer on the tube and curing—the same UV curable medical polymeric encapsulant used as an overcoat in Example 2 (Dymax 1-20323; Dymax Corporation). Subsequently, the adhesion promoting layer was exposed to a corona discharge to further enhance adhesion, and then a 6.5 cm long line of carbon-filled polymer ink (Electra$^Ω$D'Or Flexible Carbon Resistor Paste 50 Ohm; Electra Polymers & Chemicals Ltd.) was written on the adhesion promoting layer to form the piezoresistive element. This layer was cured at 100° C. for 30 minutes. Electrical leads were connected to the ends of the carbon-filled line by affixing with the silver ink described in Example 1 and curing at 100° C. for an additional 30 minutes. Resistance was measured as the tube was bent, and varied from 150 KΩ in the straight state to over the limit of detection for the multimeter (500MΩ) in the flexed state. The resistance returned to 150 KΩ when the tube was straightened again.

In the pressure sensing mode the device of the present invention uses the piezoelectric effect to measure pressure, acceleration, strain, or force by converting them to an electrical signal. The piezoelectric effect is the ability of some materials (notably crystals, certain ceramics, and biological matter such as bone, DNA, and various proteins and synthetic polymers) to generate an electric field or electric potential in response to applied mechanical stress. The effect is closely related to a change of polarization density within the material's volume. If the material is not short-circuited, the applied stress induces a voltage across the material.

In the force generating mode, the device of the present invention uses reverse piezoelectric effect. The piezoelectric effect is reversible in that materials exhibiting the direct piezoelectric effect (i.e. the production of an electric potential when stress is applied) also exhibit the reverse piezoelectric effect (i.e. the production of stress and/or strain when an electric field is applied). For example, lead zirconate titanate crystals will exhibit a maximum shape change of about 0.1% of the original dimension.

Example 6

Capacitive Pressure Sensitive Element

A commercially available conductive silver ink (101-59, Creative Materials, Inc), was written on a glass substrate to form a bottom electrode and lead. The bottom electrode ink was cured at 110° C. for 1 hour. A layer of compressible ultraviolet-curable acrylated urethane polymer (Dmax 1168-M) was then written over the bottom electrode layer at a thickness of 19 microns and cured by ultraviolet radiation.

A polished aluminum disk (1.2 cm in diameter, smaller than the bottom electrode and compressive layer area) in electrical contact with a digital multimeter and affixed to a force gauge (Omega Digital Force Meter DPFG60-44) was pressed against the top surface of the compressible material and capacitance measured as force was applied. Thus, the polished disk acted as a top electrode as well as a force transmitter. Force was cycled from 0.23 to 0.5 Kg four times, and capacitance was measured at each point. The average capacitance was calculated at each applied force. At 0.23 Kg force, the average capacitance was 144 pF, while at 0.5 Kg force, the average capacitance was 192 pF. This change in capacitance was due to deformation of the Dymax and changes in the distance between the top and bottom electrodes. Thus, the applied force, and the pressure calculated using the cross-sectional area of the contact, can be directly related to capacitance.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A pressure sensing/force generating device comprising:
    a non-planar substrate;
    a printed pressure sensitive element comprising:
        a) a piezoactive material containing ink composition capable of producing a piezoelectric effect/piezoresistive effect; and/or
        b) a dielectric material containing ink composition capable of producing a capacitive effect;
    a first printed electrode comprising a conductive ink composition; and
    a second printed electrode comprising a conductive ink composition, wherein said first and second electrodes are in electrical contact with said printed pressure sensitive element, wherein said first and second printed electrodes and said printed pressure sensitive element collectively form a pressure sensitive junction which is coupled to said non-planar substrate.

2. The pressure sensing/force generating device according to claim 1, wherein the non-planar substrate has an irregular surface.

3. The pressure sensing/force generating device according to claim 1, wherein the non-planar substrate is flexible.

4. The pressure sensing/force generating device according to claim 1 further comprising:
electrical connectors electrically coupled to said first and second printed electrodes.

5. The pressure sensing/force generating device according to claim 4 further comprising:
a voltage reader operably coupled to the electrical connectors to measure or apply voltage between the first and second printed electrodes.

6. The pressure sensing/force generating device according to claim 4 further comprising:
an ohmmeter operably coupled to the electrical connectors to measure the resistance between the first and second printed electrodes.

7. The pressure/sensing force generating device according to claim 4 further comprising:
a capacitance measuring device to measure capacitance between the first and second printed electrodes.

8. The pressure sensing/force generating device according to claim 1 further comprising:
an overcoat layer covering the pressure sensitive junction.

9. The pressure sensing/force generating device according to claim 8, wherein the overcoat layer is formed from a material selected from the group consisting of epoxy, polyacrylate, natural rubber, polyester, polyethylene napthalate, polypropylene, polystyrene, polyvinyl fluoride ethyl-vinyl acetate, ethylene acrylic acid, acetyl polymer, poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polytetrafluoroethylene, polyethylene terephthalate, polyhydroxyalkanoate, poly (p-xylylene), liquid crystal polymer, polymethylmethacrylate, polyhydroxyethylmethacrylate, polylactic acid, polyhydroxyvalerate, polyphosphazene, poly(∈-caprolactone), and mixtures or copolymers thereof.

10. The pressure sensing/force generating device according to claim 1 further comprising:
an intermediate layer positioned between the non-planar substrate and the pressure sensitive junction.

11. The pressure sensing/force generating device according to claim 10, wherein the intermediate layer is formed from a material selected from the group consisting of epoxy, polyacrylate, natural rubber, polyester, polyethylene napthalate, polypropylene, polystyrene, polyvinyl fluoride ethyl-vinyl acetate, ethylene acrylic acid, acetyl polymer, poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polytetrafluoroethylene, polyethylene terephthalate, polyhydroxyalkanoate, poly (p-xylylene), liquid crystal polymer, polymethylmethacrylate, polyhydroxyethylmethacrylate, polylactic acid, polyhydroxyvalerate, polyphosphazene, poly(∈-caprolactone), and mixtures or copolymers thereof.

12. The pressure sensing/force generating device according to claim 10, wherein the intermediate layer can function as a sealing layer, insulating layer, adhesive layer, structural support layer, or a combination thereof.

13. The pressure sensing/force generating device according to claim 1, wherein the conductive ink compositions independently comprise materials selected from the group consisting of copper, silver, gold, palladium, platinum, nickel, graphite, carbon black, various forms of conductive carbon, conductive ceramics, tin oxide, vanadium pentoxide, doped versions of the tin oxide, doped versions of vanadium oxide, and conductive polymers of polypyrrole, polythiophene, polyaniline, and mixtures thereof.

14. The pressure sensing/force generating device according to claim 1, wherein the piezoactive material containing ink composition is a piezoresistive material or a piezoelectric material.

15. The pressure sensing/force generating device according to claim 14, wherein the piezoactive material containing ink composition is a piezoresistive material comprising a dielectric binder and a conductive filler particle selected from the group consisting of carbon and a metal.

16. The pressure sensing/force generating device according to claim 14, wherein the piezoactive material containing ink composition is a piezoresistive material selected from the group consisting of doped perovskites, zinc oxide, vanadium pentoxide, tin oxide, polypyrrole, polyaniline, polyethylenedioxythiophene, and derivatives or mixtures thereof.

17. The pressure sensing/force generating device according to claim 14, wherein the piezoactive material containing ink composition is a piezoelectric material.

18. The pressure sensing/force generating device according to claim 17, wherein the piezoelectric material is a crystalline ceramic with perovskite structures selected from the group consisting of barium titanate, lead zirconate titanate, lead titanate, bismuth titanate, strontium titanate, lithium niobate, potassium niobate, lithium tantalate, zinc oxide, quartz, and doped forms thereof.

19. The pressure sensing/force generating device according to claim 17, wherein the piezoelectric material is a piezoelectric polymer selected from the group consisting of polyvinylidene fluoride (PVDF), PVDF copolymers, PVDF-hexafluoropropylene (PVDF-HFP), PVDF-trifluoroethylene (PVDF-TrFE), copolymers vinylidene fluoride, odd-numbered polyamides, ferroelectric polymers, Nylon 9, Nylon 11, cellulose, cellulose derivatives, and derivatives or mixtures thereof.

20. The pressure sensing/force generating device according to claim 1, wherein the dielectric material containing ink composition comprises a dielectric material selected from the group consisting of polyurethanes, styrene-butadiene copolymers, acrylonitrile-styrene-butadiene terpolymers, silicones, polyacrylates, epoxies, polyvinyl chloride and derivatives or mixtures thereof.

21. The pressure sensing/force generating device according to claim 1, wherein the conductive ink composition independently comprises a binder selected from the group consisting of poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polyethylene, polytetrafluoroethylene, polyethylene terephthalate, polyhydroxyalkanoate, poly(p-xylylene), liquid crystal polymer, polymethylmethacrylate, polyhydroxyethylmethacrylate, polylactide, polyglycolide, polyisoprene, poly(∈-caprolactone), cyanoacrylates, polyvinyl butyral, polyvinyl formal, polyethylene oxide, polyvinyl alcohol, polyvinylpyrrolidone, cellulose esters, cellulose ethers, carrageenan, gelatin, chitosan, and mixtures or copolymers thereof.

22. The pressure sensing/force generating device according to claim 1, wherein the substrate is formed from a material selected from the group consisting of polyester, polyethylene napthalate, polypropylene, polystyrene, polyvinyl fluoride ethyl-vinyl acetate, ethylene acrylic acid, acetyl polymer, poly(vinyl chloride), silicone, polyurethane, polyisoprene, styrene-butadiene, acrylonitrile-butadiene-styrene, polyethylene, polyamide, polyether-amide, polyimide, polyetherimide, polyetheretherketone, polyvinylidene chloride, polyvinylidene fluoride, polycarbonate, polysulfone, polytetrafuoroethylene, polyethylene terephthalate, polyhydroxyalkanoate, poly(p-xylylene), liquid crystal polymer, polymethylmethacrylate, polyhydroxyethylmethacrylate, polylactide, polyglycolide, poly(∈-caprolactone), and copolymers or mixtures thereof.

23. The pressure sensing/force generating device according to claim 1, wherein the first and second printed electrodes and the printed pressure sensitive element collectively have a thickness of 1 to 500 microns.

24. The pressure sensing/force generating device according to claim 23, wherein the first and second printed electrodes and the printed pressure sensitive element collectively have a thickness of 20 to 100 microns.

25. The pressure sensing/force generating device according to claim 1, wherein said pressure sensing device comprises a plurality of the pressure sensitive junctions.

26. A medical device comprising the pressure sensing/force generating device according to claim 1.

27. The medical device according to claim 26, wherein said medical device comprises a plurality of the pressure sensitive junctions.

28. The medical device according to claim 26, wherein the pressure sensing/force generating device is operably connected to another device to control or monitor the another device's function.

29. The medical device according to claim 26, wherein the medical device is selected from the group consisting of endotracheal tubes, endobronchial tubes, cannulae, catheters, balloons, stents, airways, sensors, stimulators, implants, intraocular or contact lenses, cochlear implants, and orthopedic implants or prostheses.

30. A method of forming a pressure sensing/force generating device, the method comprising:
   providing a non-planar substrate; and
   applying a pressure sensitive junction to said non-planar substrate, said pressure sensitive junction comprising:
   a) a printed pressure sensitive element capable of producing a piezoelectric/piezoresistive effect and comprising a piezoactive material containing ink composition; and/or
   b) a printed pressure sensitive element capable of producing a capacitive effect and comprising a dielectric material containing ink composition;
   a first printed electrode comprising a conductive ink composition; and
   a second printed electrode comprising a conductive ink composition, wherein said first and second electrodes are in electrical contact with the printed pressure sensitive element to collectively form the pressure sensitive junction.

31. The method according to claim 30, wherein said applying the pressure sensitive junction comprises:
   applying the printed pressure sensor element to the non-planar substrate;
   applying the first printed electrode to the printed pressure sensor element; and
   applying the second printed electrode to the printed pressure sensor element.

32. The method according to claim 30, wherein said applying the pressure sensitive junction comprises:
   applying the first printed electrode to the non-planar substrate;
   applying the printed pressure sensor element to the first printed electrode; and
   applying the second printed electrode to the printed pressure sensor element.

33. The method according to claim 30, wherein said applying the pressure sensitive junction comprises:
   applying the first printed electrode to the non-planar substrate;
   applying the second printed element to the non-planar substrate; and
   applying the printed pressure sensor element such that it is in electrical contact with the first and the second printed electrode.

34. The method according to claim 30, wherein said applying the pressure sensitive junction comprises:
   applying the first printed electrode to the non-planar substrate;
   applying the printed pressure sensor element to the non-planar substrate such that it is in electrical contact with the first printed electrode; and
   applying the second printed electrode to the printed pressure sensor element.

35. The method according to claim 30, wherein said applying is carried out by direct writing.

36. The method according to claim 30, wherein said applying is carried out by screen printing, jetting, laser ablation, pressure driven syringe delivery, inkjet or aerosol jet droplet based deposition, laser or ion-beam material transfer, tip based deposition techniques, or flow-based microdispensing techniques.

37. The method according to claim 30 further comprising:
   applying an overcoat layer covering the pressure sensitive junction.

38. The method according to claim 30, wherein the non-planar substrate has an irregular surface.

39. The method according to claim 30, wherein the non-planar substrate is flexible.

40. The method according to claim 30 further comprising:
   providing an intermediate layer between the non-planar substrate and the pressure sensitive junction.

41. The method according to claim 30, wherein the conductive ink composition, the piezoactive material containing ink composition, and dielectric material containing ink composition independently comprise a solvent selected from the group consisting of paraffinic hydrocarbons, aromatic hydrocarbons, halohydrocarbons, ethers, ketones, aldehydes, esters, nitrogen-containing solvents, sulfur containing solvents, alcohols, polyhydric alcohols, phenols, water, and mixtures thereof.

* * * * *